US007550997B2

(12) United States Patent
Gruijl

(10) Patent No.: US 7,550,997 B2
(45) Date of Patent: Jun. 23, 2009

(54) 4-LEVEL LOGIC DECODER

(75) Inventor: Robert Gruijl, San Francisco, CA (US)

(73) Assignee: NXP B.V., Eindhoven (NL)

( * ) Notice: Subject to any disclaimer, the term of this patent is extended or adjusted under 35 U.S.C. 154(b) by 26 days.

(21) Appl. No.: 11/996,315

(22) PCT Filed: Jul. 21, 2006

(86) PCT No.: PCT/IB2006/052515

§ 371 (c)(1),
(2), (4) Date: Jan. 21, 2008

(87) PCT Pub. No.: WO2007/010503

PCT Pub. Date: Jan. 25, 2007

(65) Prior Publication Data

US 2008/0211543 A1        Sep. 4, 2008

Related U.S. Application Data

(60) Provisional application No. 60/702,052, filed on Jul. 22, 2005, provisional application No. 60/735,453, filed on Nov. 10, 2005.

(51) Int. Cl.
*H03K 19/02* (2006.01)
(52) U.S. Cl. .......................................... 326/60; 326/93
(58) Field of Classification Search ................... 326/59, 326/60, 104, 105
See application file for complete search history.

(56) References Cited

U.S. PATENT DOCUMENTS 6,711,218 B2 *   3/2004   Dent .......................... 375/341
7,260,155 B2 *   8/2007   Stonick et al. .............. 375/292

OTHER PUBLICATIONS

Kazutaka, Taniguchi "Four-Valued Dynamic Encoder and Decoder Circuits for CMOS Multivalued Logic Systems" IEICE Transactions on Electronics, Electronics Society, Tokyo, JP, vol. E75-C, No. 10, Oct. 1, 1992, pp. 1275-1280.

* cited by examiner

*Primary Examiner*—Don P Le

(57) ABSTRACT

The present invention relates to a 4-level logic decoder for decoding n 4-level input data signals into n 2-bit signals. The 4-level logic decoder comprises n decoding circuits with each decoding circuit comprising comparison circuitries for comparing the 4-level input data signal with a clock signal and a one-bit data signal. In dependence upon the comparison results signals are provided to a decode logic circuit, which are indicative of a data bit value of the 4-level input data signal representing one of the clock signal, the one-bit data signal, and static values of the 4-level input data signal. In dependence upon the signals the decode logic circuit generates then a 2-bit output data signal. The 4-level logic decoder is easily implemented using simple circuit of logic components, which allow modeling using an HDL.

16 Claims, 3 Drawing Sheets

4-LEVEL LOGIC DECODER

This application claims priority of an earlier filed application Ser. No. 60/702,052 titled, "An Efficient Implementation of a 4-Level, N-Wire to 2N-Bit Logic Decoder," filed on Jul. 22, 2005, and is incorporated by reference in its entirety.

This invention relates generally to multi-level logic, and in particular to a circuit that decodes n 2-bit data from n 4-level logic data channels for use in combination with high speed serial buses.

High speed serial buses are used in a wide variety of applications, including computer systems, computer networking and telecommunication systems. The objective is to transport as much data as possible, as fast as possible, and as accurately as possible. Conventional digital circuits use only two levels High or Low—corresponding to binary values '1' or '0'—on a data bit. An alternative to the conventional digital circuits is to use multi-level encoded data with more than two levels. Multi-level encoding uses various voltage levels to indicate the value of data being transmitted. For example, four different voltage levels are used to represent two bits of information, with one level used to represent the digital value 00, a $2^{nd}$ level to represent the digital value 01, a $3^{rd}$ level to represent the digital value 10, and a $4^{th}$ level to represent the digital value of 11. However, the use of multi-level encoding is substantially complicated by ever-increasing improvements of integrated circuits powered by smaller voltages, resulting in smaller voltage differences between the levels.

This problem is overcome by replacing the different voltage levels with additional logic levels using a clock and a one-bit data signal for encoding 4-level data. At a recipient, the 4-level data are decoded to 2-bit data using the clock and the one-bit data signal. Current 4-level logic decoders use delay cells for detecting differences between dynamic and static signals, and flip-flops to store these differences and to iterate sequentially the 2-bit data, resulting in a complicated design. Furthermore, the use of delay cell prevents use of a Hardware Design Language (HDL) for modeling the decoder circuitry, requiring manual gate-level implementation and manual timing checks.

It would be desirable to provide a 4-level logic decoder of substantially simpler design that allows use of an HDL for modeling the decoder circuitry.

It is, therefore, an object of the invention to provide a 4-level, n channel to n 2-bit logic decoder of simple design.

It is further an object of the invention to provide a 4-level, n channel to n 2-bit logic decoder allowing use of an HDL for modeling the decoder circuitry.

In accordance with the present invention there is provided a 4-level logic decoder. The 4-level logic decoder comprises a clock signal input port for receiving a clock signal, a one-bit data input port for receiving a one-bit data signal, and an n channel 4-level data input port for receiving n 4-level input data signals with n being at least one. The n 4-level input data signals are 4-level encoded using the clock signal and the one-bit data signal. The one-bit data signal changes its bit value at least once during a predetermined time interval. Each of n decoding circuits is connected to the clock signal input port, the one-bit data input port, one channel of the n channel 4-level data input port, and one channel of an n channel 2-bit output port. Each of the n decoding circuits comprises a first and a second comparison circuitry, a gate circuitry, and a decode logic circuitry. The first comparison circuitry in communication with the one channel of the n channel 4-level data input port and the clock signal input port compares the 4-level input data signal with the clock signal and provides a first comparison data signal in dependence thereupon. The second comparison circuitry in communication with the one channel of the n channel 4-level data input port and the one-bit data signal input port compares the 4-level input data signal with the one-bit data signal and provides a second comparison data signal in dependence thereupon. The gate circuitry in communication with the first comparison circuitry, the second comparison circuitry, and the one channel of the n channel 4-level data input port transmits a static value of the 4-level input data signal, if the first comparison data signal and the second comparison data signal are indicative of a data bit value of the 4-level input data signal being one of static values of the 4-level input data signal. The decode logic circuitry in communication with the first comparison circuitry, the second comparison circuitry, the gate circuitry, and the one channel of the n channel 2-bit output port generates a 2-bit output data signal in dependence upon the first comparison data signal, the second comparison data signal, and the static value. The first and the second comparison data signal are indicative of the data bit value of the 4-level input data signal representing one of the clock signal, the one-bit data signal, and the static values of the 4-level input data signal with the second comparison data signal being based on the one-bit data signal changing its bit value at least once during the predetermined time interval.

Exemplary embodiments of the invention will now be described in conjunction with the following drawings, in which.

Figure 1:
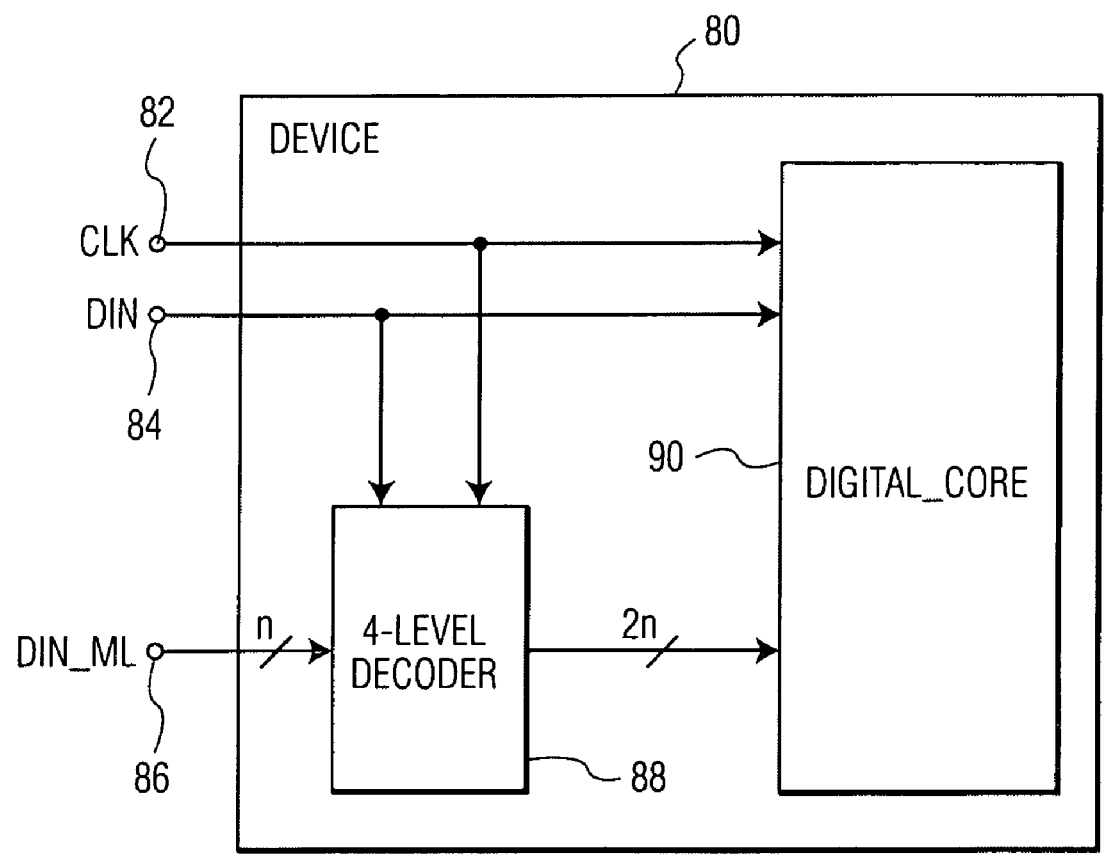
FIG. 1 is a simplified block diagram illustrating implementation of a 4-level logic decoder in a digital device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

Conventional digital circuits use only two levels High and Low to represent the two binary values '1' and '0' on a data bit, in which case it is possible to represent a 2n-bit number using n bits. In multi-level logic, the number of levels used for data transfer in a single data channel is p, with p>2. For example, in a circuit with a 4V supply voltage, p=4 levels—4V, 3V, 2V, and 1V—are used in a single channel for data transfer. This allows an n-channel data bus to represent a 4n-bit number. Generally, in a circuit having n channels for data transfer and using p levels, the number of represented values is:

$$m=p^n, \tag{1}$$

where m is an r-bit binary number with $$r=^2\log(p)n. \tag{2}$$

Instead of using different voltage levels, it is possible to introduce additional logic levels by using a clock signal and a one-bit data signal of a digital circuit as logic values for encoding and decoding. FIG. 1 shows a digital device 80 having a clock signal input port 82 for receiving a clock signal clk, a one-bit data input port 84 for receiving a one-bit data signal din, and a one channel 4-level data input port 86 for receiving a 4-level data signal din_ml. The clock signal input port 82 and the one-bit data input port 84 are connected to a 4-level logic decoder 88 and digital core circuitry 90 such as a CPU. The 4-level logic decoder 88 is further connected to the 4-level data input port 86 and the digital core circuitry 90. Together with the clock signal clk and the one-bit data signal din, the 4-level data are physically represented by 4 different logic levels—'1', '0', clk, and din. Using the clock signal clk and the one-bit data signal din, the 4-level logic decoder 88 transforms the 4-level data into 2-bit data for provision to the digital core circuitry 90. Analogously, having an n channel input port instead of a one channel input port 86, it is possible to represent 4n values.

Figure 2:
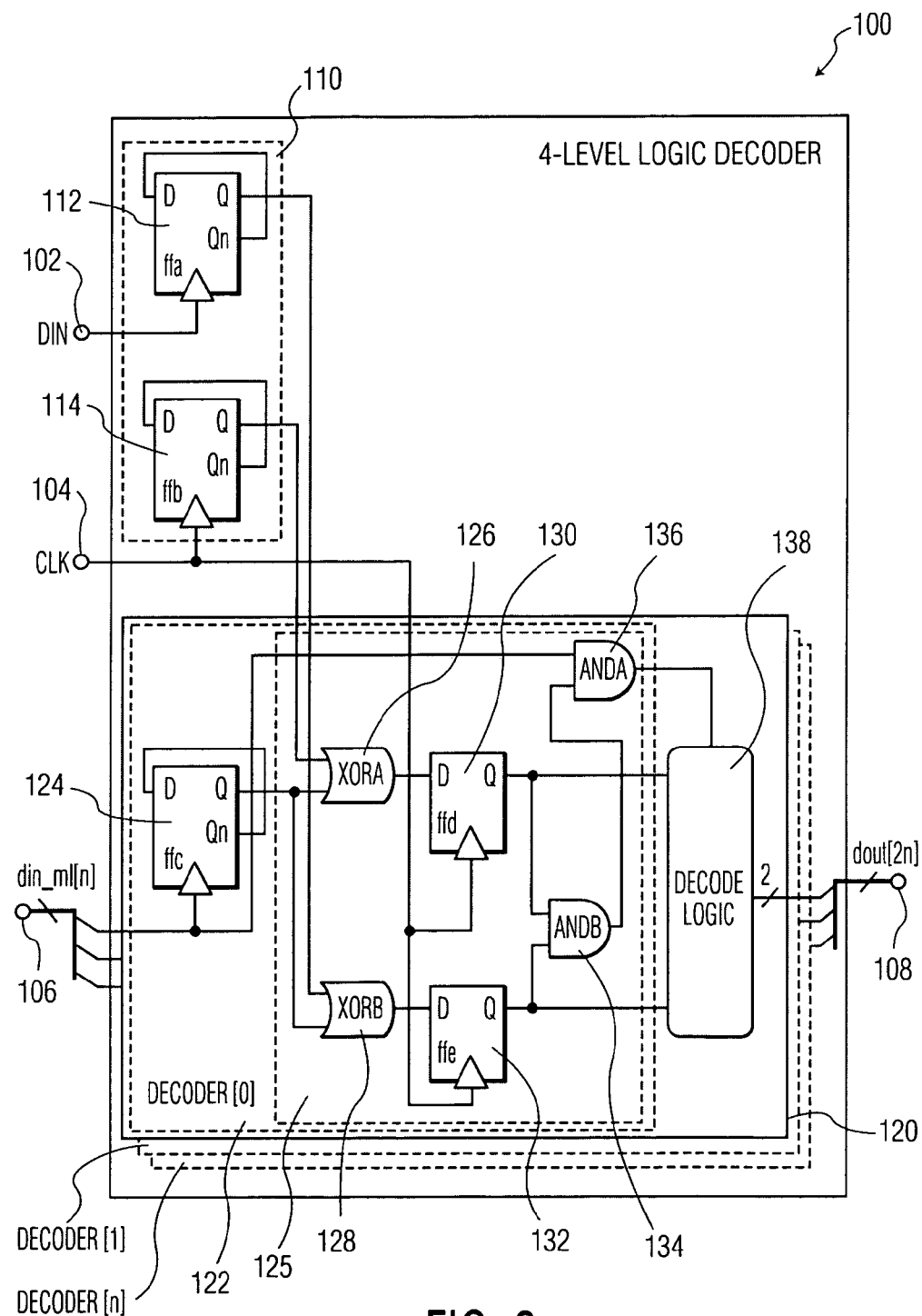
FIG. 2 is a simplified block diagram illustrating a preferred embodiment of a 4-level logic decoder according to the invention; and, FIG. 3 is a simplified flow diagram illustrating data processing using the 4-level logic decoder according to the invention.

Referring to FIG. 2, a preferred embodiment of a 4-level logic decoder 100 according to the invention is shown. The 4-level logic decoder 100 comprises a one-bit data input port 102 for receiving a one-bit data signal din, a clock signal input port 104 for receiving a clock signal clk, an n channel 4-level data input port 106 for receiving n 4-level input data signals din_ml[n] from, for example, a serial data bus, and an n channel 2-level output data signal port 108 for providing n 2-bit output data signals dout[2n] to a digital core circuitry such as a CPU, not shown.

The 4-level input data comprise one of 2 static values—binary '1' and '0'—and 2 dynamic signals, i.e. a data bit of the 4-level input data signal represents one of 4 levels: binary '1'; binary '0'; one-bit data signal din; and clock signal clk. Prior to decoding, the 4-level input data signal din_ml[n], the one-bit data signal din, and the clock signal clk, are preprocessed to extract information indicating which of the 4 levels is represented by a data bit of the 4-level input data signal din_ml[n].

Dividing circuitry 110 in communication with the one-bit data input port 102 and the clock signal input port 104 comprises two dividers 112 and 114, for example, D-type flip-flops connected as toggle type, for processing the received one-bit data signal din and the clock signal clk such that the processed signal changes its bit value at a same pulse edge of the unprocessed signal, resulting in a division of the number of pulses by two, respectively. The 4-level logic decoder 100 further comprises n parallel decoding circuits 120, each connected to one of the n channels of the n channel 4-level data input port 106 and to one of the n channels of the n channel 2-level output data signal port 108. For sake of simplicity, design of only one of the n decoding circuits 120 will be described. The n decoding circuits 120 are of substantially same design and operate simultaneously. The decoding circuit 120 comprises preprocessing circuitry 122 and decode logic circuitry 138. The preprocessing circuitry 122 comprises a divider 124, for example, a D-type flip-flop connected as toggle type, for processing the received 4-level input data signal din_ml[n] in a similar fashion as the one-bit data signal din and the clock signal clk. A. Q output port of the divider 124 is connected to comparison circuitry 125, i.e. to a first input port of a first XOR gate 126 and to a first input port of a second XOR gate 128. A second input port of the first XOR gate 126 is connected to a Q output port of the divider 114, while a second input port of the second XOR gate 128 is connected to a Q output port of the divider 112. An output port of the first XOR gate 126 is connected to a D input port of a first flip-flop 130, while an output port of the second XOR gate 128 is connected to a D input port of a second flip-flop 130. The first flip-flop 130 and the second flip-flop 132 are, for example, edge triggered D-type flip-flops, as shown in FIG. 2. A clock signal input port of the first flip-flop 130 and the second flip-flop 132 is connected to the clock signal input port 104 for receiving the clock signal clk. Q output ports of the first flip-flop 130 and the second flip-flop 132 are connected to respective first and second input ports of the decode logic circuitry 138 as well as to respective first and second input ports of a first AND gate 134. An output port of the first AND gate 134 is connected to a first input port of a second AND gate 136 with a second input port being connected to one channel of the n channel 4-level data input port 106. An output port of the second AND gate is then connected to a third input port of the decode logic circuitry 138.

In operation, the divided 4-level input data signal din_ml[n] is compared: to the divided clock signal clk in the first XOR gate 126 for providing a first comparison signal; and to the divided one-bit data signal din in the second XOR gate 128 for providing a second comparison signal. When the divided 4-level input data signal din_ml[n] is different from the divided clock signal clk and equal to the divided one-bit data signal din, the first comparison signal sets the first flip-flop 130 for providing an output signal indicative of a logic '1', while the second flip-flop 132 provides a logic '0'. Analogously, when the divided 4-level input data signal din_ml[n] is different from the divided one-bit data signal din, the second comparison signal sets the second flip-flop 132 for providing an output signal indicative of a logic '1', while the first flip-flop 130 provides a logic '0'. These output signal are then transmitted to the respective first and second input ports of the decode logic circuitry 138 for generating a 2-bit data signal in dependence thereupon and according to, for example, the decode logic shown in Table 1 below. When the divided 4-level input data signal din_ml[n] is different from both, the divided clock signal clk and the divided one-bit data signal din, both flip-flops 130 and 132 are set for providing a logic '1'. In this case, the first AND gate 134 produces a logic '1' for provision to the first input port of the second AND gate 136. Together with the 4-level input data signal din_ml[n] received at the second input port, the second AND gate 136 produces a logic '1' when the 4-level input data signal din_ml[n] is indicative of a logic '1' and a logic '0' when the 4-level input data signal din_ml[n] is indicative of a logic '0', which is then transmitted to the third input port of the decode logic circuitry 138. In dependence upon the signals received at the first and second input ports the decode logic circuitry 138 generates a 2-bit binary signal as shown in Table 1.

TABLE 1

| Din_ml[n] | 136 | 130 | 132 | Dout |
|---|---|---|---|---|
| din | X | 1 | 0 | 00 |
| clk | X | 0 | 1 | 01 |
| '1' | 1 | 1 | 1 | 10 |
| '0' | 0 | 1 | 1 | 11 |

When the signals received from the flip-flops 130 and 132 are different, the decode logic circuitry 138 generates a '00' or '01' in dependence upon which of the flip-flops 130 and 132 provides a logic '1'. When both flip-flops provide a logic '1', the decode logic circuitry 138 generates a '10' or '11' in dependence upon the logic value received at the third input port. Logic circuits for realizing the logic truth table shown in Table 1 are well known in the art.

To ensure proper operation of the 4-level logic decoder 100 the one-bit data signal din needs to change from '0' to '1', or vice versa, at least once within a predetermined time interval, i.e. before the 2-bit output data signal dout is used. Otherwise, the 4-level logic decoder 100 is not able to differentiate between the one-bit data signal din and a static value '0' or '1'. If the output signal is used after m cycles of the clock signal clk, the m-bit data on din are only allowed to represent 2m−

(m+1) values. For example, with m=4 the values not allowed on din are {1111}, {1110}, {1100}, {1000}, and {0000}, because din does not change for these values. The exclusion of the (m+1) values that are not allowed does not pose a substantial design restriction in applications where din is a serial input. In order to properly differentiate between the static values '1' and '0' and dynamic signals clk and din, the 4-level logic decoder 100 needs p clock pulses on clk, with p being the maximum number of clock pulses where din does not change from '0' to '1', or vice versa. This latency is well within the limits for typical high-speed serial bus applications.

Figure 3:
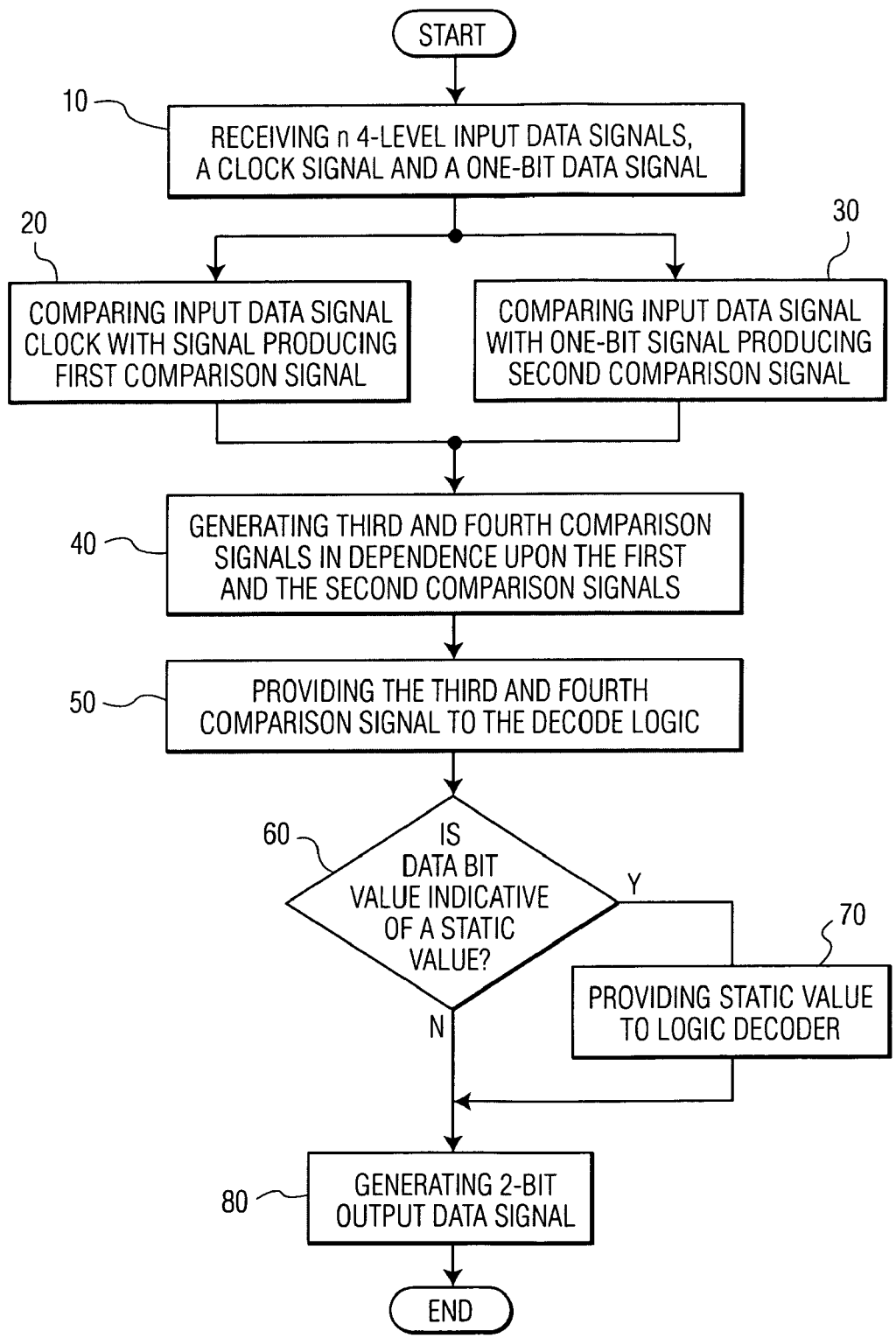

Referring to FIG. 3, a simplified flow diagram of a method for decoding a 4-level input data signal using a 4-level logic decoder 100 according to the invention shown. Referring to box 10, n 4-level input data signals with n being at least one, a clock signal, and a one-bit data signal are received. The input data signal is 4-level encoded using the clock signal and the one-bit data signal. Further, the one-bit data signal changes its bit value at least once during a predetermined time interval. Upon receipt, each of the n 4-level input data signals, the clock signal, and the one-bit data signal are processed using the dividers 124, 114, and 112, respectively, such that the processed signal changes its bit value at a same pulse edge of the unprocessed signal resulting in a division of the number of pulses by two. Using the XOR gate 126 of the comparison circuitry 125 each of the n 4-level input data signals is compared with the clock signal and for each of the n 4-level input data signals a first comparison data signal is provided in dependence thereupon—box 20. Simultaneously, using the XOR gate 128 each of the n 4-level input data signals is compared with the one-bit data signal and for each of the n 4-level input data signals a second comparison data signal is provided in dependence thereupon—box 30. Using flip-flops 130 and 132 for each of the n 4-level input data signals a third and fourth comparison data signal is generated, respectively, in dependence upon the first and the second comparison data signal—box 40. Based on the knowledge that the one-bit data signal changes its bit value at least once during the predetermined time interval, the third and the fourth comparison data signal are then indicative of a bit value of the 4-level input data signal representing one of the clock signal, the one-bit data signal, and the static values of the 4-level input data signal. Referring to box 50, for each of the n 4-level input data signals the third and the fourth comparison data signal are provided to a the corresponding decode logic circuitry 138. If the third and the fourth comparison data signal are indicative of a data bit value of the 4-level input data signal being one of the static values of the 4-level input data signal—box 60—the static value is provided to the decode logic circuitry 138 using AND gates 134 and 136—box 70. The decode logic circuitry 138 then generates a 2-bit output data signal in dependence upon one of the third and the fourth comparison data signal and the static value—box 80.

The 4-level logic decoder 100, as shown in the preferred embodiment, is realized using a simple design comprising only 3n+2 flip-flops, 2n XOR gates, and 2n AND gates for preprocessing n 4-level input data signals din_ml[n] prior provision to the decode logic circuitry 138. This is realized by exploiting a minor restriction on the one-bit data signal din, which is easily overcome in the design of high speed serial buses, resulting in a fully synchronous circuit. Providing a 4-level logic decoder without use of delay-cells is highly advantageous by allowing modeling of the circuitry using an HDL and, thus, omitting the need for manual gate-level implementation and manual timing checks, substantially reducing design time and cost. Furthermore, the 4-level logic decoder 100 is easily implemented using circuitry of substantially smaller size than decoders comprising delay cells. Due to the use of simple logic components and the substantially smaller size, manufacturing costs are reduced considerably. Preferably, all components are integrated on a single semiconductor chip, which is facilitated by the use of same-design components for the n decoding circuits 120, requiring substantially same manufacturing steps. The 4-level logic decoder 100 is, for example, highly beneficial in combination with I2C serial buses. It is possible to implement an I2C serial bus slave device having $4^n$ selectable slave addresses by providing n 4-level input data signals din_ml[n] representing on a data bit either one of the two static values '1' and '0', or one of the two dynamic signals: the I2C clock signal scl and the I2C serial input sda. Knowing system requirements of a high speed serial bus and a digital core circuitry, it is possible to design the 4-level logic decoder 100 on a computer by executing commands based on the above description stored on a storage medium.

The implementation of the 4-level logic decoder 100 according to the invention has been illustrated using a preferred embodiment, but as is evident, is not limited thereto. There are various possibilities for implementing the preprocessing circuitry using logic components and based on the knowledge that the one-bit data signal changes its bit value at least once during a predetermined time interval. Furthermore, the preprocessing circuitry of the 4-level logic decoder 100 is easily adapted to accommodate different encoding schemes of 4-level input data signals.

Numerous other embodiments of the invention will be apparent to persons skilled in the art without departing from the spirit and scope of the invention as defined in the appended claims.

What is claimed is:

1. A method for decoding a 4-level input data signal comprising: receiving n 4-level input data signals with n being at least one, a clock signal, and a one-bit data signal, the input data signal being 4-level encoded by using the clock signal and the one-bit data signal, the one-bit data signal changing its bit value at least once during a predetermined time interval; comparing each of the n 4-level input data signals with the clock signal and providing for each of the n 4-level input data signals a first comparison data signal in dependence thereupon; comparing each of the n 4-level input data signals with the one-bit data signal and providing for each of the n 4-level input data signals a second comparison data signal in dependence thereupon; determining for each of the n 4-level input data signals if a data bit value of the 4-level input data signal is representing one of the clock signal, the one-bit data signal, and static values of the 4-level input data signal using the first and the second comparison data signal and based on the one-bit data signal changing its bit value at least once during the predetermined time interval; and, using a decode logic circuit generating for each of the n 4-level input data signals a 2-bit output data signal in dependence upon the determined data bit value representation.

2. A method for decoding a 4-level input data signal as defined in claim 1 comprising processing the clock signal, the one-bit data signal, and each of the n 4-level input data signals such that the processed signal changes its bit value at a same pulse edge of the unprocessed signal resulting in a division of the number of pulses by two.

3. A method for decoding a 4-level input data signal as defined in claim 1 comprising generating a third and fourth comparison data signal in dependence upon the first and the second comparison data signal, the third and the fourth comparison data signal being indicative of the data bit value of the 4-level input data signal representing one of the clock signal, the one-bit data signal, and the static values.

4. A method for decoding a 4-level input data signal as defined in claim 3 comprising providing the third and the fourth comparison data signal to the decode logic circuit.

5. A method for decoding a 4-level input data signal as defined in claim 1 comprising providing the static value of the 4-level input data signal to the decode logic circuit.

6. A method for decoding a 4-level input data signal as defined in claim 4 wherein the 2-bit output data signal is generated using the third and the fourth comparison data signal.

7. A method for decoding a 4-level input data signal as defined in claim 5 wherein the 2-bit output data signal is generated using the static value of the 4-level input data signal.

8. A 4-level logic decoder comprising: a clock signal input port for receiving a clock signal; a one-bit data input port for receiving a one-bit data signal, the one-bit data signal changing its bit value at least once during a predetermined time interval; an n channel 4-level data input port for receiving n 4-level input data signals with n being at least one, the n 4-level input data signals being 4-level encoded using the clock signal and the one-bit data signal; and, n decoding circuits, each of the n decoding circuits being coupled to the clock signal input port, the one-bit data input port, one channel of the n channel 4-level data input port, and one channel of an n channel 2-bit output port, each of the n decoding circuits comprising: a first comparison circuit in communication with the one channel of the n channel 4-level data input port and the clock signal input port, the first comparison circuit for comparing the 4-level input data signal with the clock signal and for providing a first comparison data signal in dependence thereupon; a second comparison circuit in communication with the one channel of the n channel 4-level data input port and the one-bit data signal input port, the first comparison circuit for comparing the 4-level input data signal with the one-bit data signal and providing a second comparison data signal in dependence thereupon; a gate circuit in communication with the first comparison circuit, the second comparison circuit, and the one channel of the n channel 4-level data input port, the gate circuit for transmitting a static value of the 4-level input data signal, if the first comparison data signal and the second comparison data signal are indicative of a data bit value of the 4-level input data signal being one of static values of the 4-level input data signal; and, a decode logic circuit in communication with the first comparison circuit, the second comparison circuit, the gate circuit , and the one channel of the n channel 2-bit output port, the decode logic circuit for generating a 2-bit output data signal in dependence upon the first comparison data signal, the second comparison data signal, and the static value, wherein the first and the second comparison data signal are indicative of the data bit value of the 4-level input data signal representing one of the clock signal, the one-bit data signal, and the static values of the 4-level input data signal and based on the one-bit data signal changing its bit value at least once during the predetermined time interval.

9. A 4-level logic decoder as defined in claim 8 comprising: a first divider interposed between the clock signal input port and the n decoding circuits, the first divider for processing the clock signal such that the processed signal changes its bit value at a same pulse edge of the unprocessed signal; a second divider interposed between the one-bit data input port and the n decoding circuits, the second divider for processing the one-bit data signal such that the processed signal changes its bit value at a same pulse edge of the unprocessed signal; and, a third divider disposed in each of the decoding circuits and in communication with the n channel 4-level data input port and the first and the second comparison circuit, the third divider for processing the 4-level input data signal such that the processed signal changes its bit value at a same pulse edge of the unprocessed signal.

10. A 4-level logic decoder as defined in claim 9 wherein the first, the second and the third dividers are flip-flops.

11. A 4-level logic decoder as defined in claim 10 wherein the first, the second and the third dividers are D-type flip-flops coupled as toggle type.

12. A 4-level logic decoder as defined in claim 9 wherein the first comparison circuit comprises a first XOR gate with a first input port coupled to a Q output port of the first divider and a second input port coupled to a Q output port of the third divider, and wherein the second comparison circuit comprises a second XOR gate with a first input port coupled to a Q output port of the second divider and a second input port coupled to the Q output port of the third divider.

13. A 4-level logic decoder as defined in claim 12 wherein the first comparison circuit comprises a first flip-flop with a D input port coupled to an output port of the first XOR gate, a clock signal port coupled to the clock signal input port, and a Q output port coupled to a first input port of the decode logic circuit, and wherein the second comparison circuit comprises a second flip-flop with a D input port coupled to an output port of the second XOR gate, a clock signal port coupled to the clock signal input port, and a Q output port coupled to a second input port of the decode logic circuit.

14. A 4-level logic decoder as defined in claim 13 wherein the first flip-flop and the second flip-flop are D-type flip-flops.

15. A 4-level logic decoder as defined in claim 13 wherein the gate circuit comprises: a first AND gate with a first input port coupled to a Q output port of the first flip-flop and a second input port coupled to a Q output port of the second flip-flop; and, a second AND gate with a first input port coupled to the 4-level data input port, a second input port coupled to an output port of the first AND gate, and an output port coupled to a third input port of the decode logic circuit.

16. A storage medium having data stored therein, the data for when executed resulting in an integrated circuit design of a 4-level logic decoder comprising: a clock signal input port for receiving a clock signal; a one-bit data input port for receiving a one-bit data signal, the one-bit data signal changing its bit value at least once during a predetermined time interval; an n channel 4-level data input port for receiving n 4-level input data signals with n being at least one, the n 4-level input data signals being 4-level encoded using the clock signal and the one-bit data signal; and, n decoding circuits, each of the n decoding circuits being coupled to the clock signal input port, the one-bit data input port, one channel of the n channel 4-level data input port, and one channel of an n channel 2-bit output port, each of the n decoding circuits comprising: a first comparison circuit in communication with the one channel of the n channel 4-level data input port and the clock signal input port, the first comparison circuit for comparing the 4-level input data signal with the clock signal and for providing a first comparison data signal in dependence thereupon; a second comparison circuit in communication with the one channel of the n channel 4-level data input port and the one-bit data signal input port, the first comparison circuit for comparing the 4-level input data signal with the one-bit data signal and providing a second comparison data signal in dependence thereupon; a gate circuit in communication with the first comparison circuit, the second comparison circuit, and the one channel of the n channel 4-level data input port, the gate circuit for transmitting a static value of the 4-level input data signal, if the first comparison data signal and the second comparison data signal are indicative of a data bit value of the 4-level input data signal being one of static values of the 4-level input data signal; and, a decode logic circuit in communication with the first comparison circuit, the second comparison circuit, the gate circuit, and the one channel of the n channel 2-bit output port, the decode logic circuit for generating a 2-bit output data signal in dependence upon the first comparison data signal, the second comparison data signal, and the static value, wherein the first and the second comparison data signal are indicative of the data bit value of the 4-level input data signal representing one of the clock signal, the one-bit data signal, and the static values of the 4-level input data signal and based on the one-bit data signal changing its bit value at least once during the predetermined time interval.

* * * * *